(12) United States Patent
Yan et al.

(10) Patent No.: US 12,484,226 B2
(45) Date of Patent: Nov. 25, 2025

(54) THREE-DIMENSIONAL NAND MEMORY DEVICE AND METHOD THAT ELIMINATE LEAKAGE CURRENTS AND SHORT CIRCUITS

(71) Applicant: Yangtze Memory Technologies Co., Ltd., Wuhan (CN)

(72) Inventors: Longxiang Yan, Wuhan (CN); Wei Xu, Wuhan (CN); Bo Xu, Wuhan (CN); Fazhan Wang, Wuhan (CN); Lei Xue, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 575 days.

(21) Appl. No.: 17/862,191

(22) Filed: Jul. 11, 2022

(65) Prior Publication Data
US 2024/0015973 A1    Jan. 11, 2024

(51) Int. Cl.
*H01L 21/425* (2006.01)
*H10B 43/35* (2023.01)
*H10B 99/00* (2023.01)

(52) U.S. Cl.
CPC ........... *H10B 43/35* (2023.02); *H01L 21/425* (2013.01); *H10B 99/00* (2023.02)

(58) Field of Classification Search
CPC ........ H10B 43/35; H10B 99/00; H10B 41/27; H10B 43/27; H01L 21/425
See application file for complete search history.

(56) References Cited

U.S. PATENT DOCUMENTS

| | | | | |
|---|---|---|---|---|
| 5,930,608 A * | 7/1999 | Yamazaki | .......... | H10D 30/0314 438/166 |
| 9,659,947 B1 * | 5/2017 | Venkataramani | .. | H10D 30/6892 |
| 9,679,907 B1 * | 6/2017 | Kaneko | ................... | H10B 43/35 |
| 2008/0278995 A1 * | 11/2008 | Ho | .......................... | G11C 11/15 365/158 |
| 2017/0186746 A1 * | 6/2017 | Chung | ................. | H10D 30/024 |
| 2017/0200611 A1 * | 7/2017 | Park | ....................... | H10D 30/63 |
| 2019/0067323 A1 * | 2/2019 | Xu | ......................... | H10B 43/27 |
| 2020/0066751 A1 * | 2/2020 | Yoshimizu | ......... | H10D 30/0413 |
| 2020/0218156 A1 * | 7/2020 | Choi | ....................... | H10D 84/83 |
| 2020/0350168 A1 * | 11/2020 | Kim | .................. | H01L 21/02532 |
| 2021/0090992 A1 * | 3/2021 | Li | .......................... | H10B 43/27 |

* cited by examiner

*Primary Examiner* — William B Partridge
*Assistant Examiner* — Erik A. Anderson
(74) *Attorney, Agent, or Firm* — Anova Law Group, PLLC

(57) ABSTRACT

Three-dimensional NAND memory device and method that eliminate leakage currents and short circuits are provided. The method includes: forming a gate line slit through a plurality of alternating layers of an oxide layer and a conductive material layer, where the conductive material layer is further formed on a sidewall and a bottom of the gate line slit; performing an ion implantation process to dope at least a portion of the conductive material layer that is on the bottom and/or a portion of the sidewall of the gate line slit; and performing an etch process in the gate line slit to remove the conductive material layer that is weakened by the ion implantation process.

20 Claims, 14 Drawing Sheets

THREE-DIMENSIONAL NAND MEMORY DEVICE AND METHOD THAT ELIMINATE LEAKAGE CURRENTS AND SHORT CIRCUITS

TECHNICAL FIELD

The present disclosure relates to the technical field of integrated circuits (ICs) and, more particularly, to a method of forming a three-dimensional (3D) NAND memory device and a 3D NAND memory device.

BACKGROUND

An NAND memory device is a non-volatile type of memory that does not require power to retain stored data. The growing demands of consumer electronics, cloud computing, and big data bring about a constant need of NAND memories of larger capacity and better performance. As conventional two-dimensional (2D) NAND memory device approaches its physical limits, three-dimensional (3D) NAND memory device is now playing an important role. The 3D NAND memory device uses multiple stacked layers in a single chip to achieve higher density, higher capacity, faster performance, lower power consumption, and better cost efficiency.

The 3D NAND memory device includes a substrate having a doped region, a layer stack, memory cells, a semiconductor layer, a contact structure, and gate line slit structures. The gate line slit structures are formed through the layer stack to separate the memory cells into blocks. In the process of forming the gate line slit, residue metals may remain on sidewalls of the gate line slit structures, causing leakage currents between adjacent memory cells. The present disclosure improves the process of forming the gate line slit to eliminate the leakage currents.

SUMMARY

One aspect of the present disclosure provides a method of forming a three-dimensional (3D) NAND memory device. The method includes: forming a gate line slit through a plurality of alternating layers of an oxide layer and a conductive material layer, where the conductive material layer is further formed on a sidewall and a bottom of the gate line slit; performing an ion implantation process to dope at least a portion of the conductive material layer that is on the bottom and/or a portion of the sidewall of the gate line slit; and performing an etch process to remove the conductive material layer the is weakened by the ion implantation process from the sidewall and the bottom of the gate line slit.

Another aspect of the present disclosure provides a three-dimensional (3D) NAND memory device. The 3D NAND memory device includes: a substrate; a layer stack formed on the substrate; memory cells formed in the layer stack; a contact structure connecting the memory cells; and gate line slit structures formed through the layer stack to separate the memory cells into blocks without any residue of conductive material causing short circuits between different memory cells. The gate line slit structures are formed by: forming a gate line slit through a plurality of alternating layers of an oxide layer and a conductive material layer, where the conductive material layer is further formed on a sidewall and a bottom of the gate line slit; performing an ion implantation process to dope at least a portion of the conductive material layer that is on the bottom and/or a portion of the sidewall of the gate line slit; and performing an etch process to remove the conductive material layer that is weakened by the ion implantation process.

BRIEF DESCRIPTION OF THE DRAWINGS

To more clearly illustrate the technical solution in embodiments of the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Technical solutions in the embodiments of the present disclosure will be clearly described below with reference to the accompanying drawings. Although the accompanying drawings show exemplary implementation methods of the present disclosure, it should be understood that the present disclosure can be implemented in various forms and should not be limited by the embodiments set forth herein. On the contrary, the embodiments are provided to enable a more thorough understanding of the present disclosure and to fully convey the scope of the present disclosure to those skilled in the art.

In the following paragraphs, the present disclosure will be described in more detail with examples and with reference to the accompanying drawings. Advantages and features of the present disclosure will be apparent according to the description and the claims. It should be noted that the accompanying drawings all adopt a simplified form and use imprecise proportions. For convenience and clarity, the drawings are only used to assist in describing objectives of the embodiments of the present disclosure.

In the embodiments of the present disclosure, a sentence like "A and B are connected" includes situations where A and B are connected with each other and are in contact with each other or where A and B are connected through another component and without directly contacting with each other.

In the embodiments of the present disclosure, terms such as "first" and "second" are used to distinguish similar objects and are not necessarily used to describe a specific sequence or order.

In the embodiments of the present disclosure, a term "layer" refers to a material portion including a region having a thickness. A layer may extend over an entirety of a lower or upper structure, or may have a range smaller than that of the lower or upper structure. In addition, the layer may be a region of homogeneous or heterogeneous continuous structure having a thickness smaller than a thickness of the continuous structure. For example, the layer may be disposed between a top surface and a bottom surface of the continuous structure or may be disposed between two planes where the top surface and the bottom surface are located respectively. The layer may extend horizontally, vertically, and/or along an inclined surface. The layer may include a plurality of sub-layers.

It will be appreciated that the described embodiments are some rather than all of the embodiments of the present disclosure. Other embodiments obtained by those having ordinary skills in the art on the basis of the described embodiments without inventive efforts should fall within the scope of the present disclosure.

Embodiments of the present disclosure will be described in detail in connection with the drawings. Under circumstances of no conflict, the following embodiments and features in the embodiments may be combined with each other.

Figure 1:
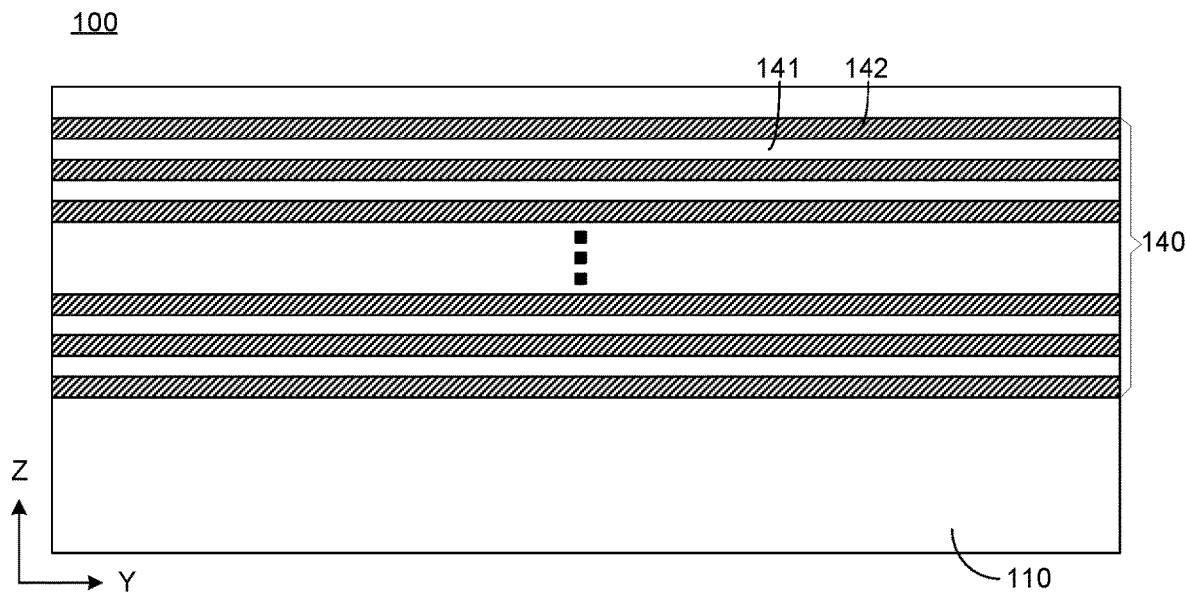
FIGS. 1 and 2 illustrate schematically cross-sectional views of a three-dimensional (3D) NAND memory device in an exemplary fabrication process according to embodiments of the present disclosure.

FIGS. 1-9 schematically show a fabrication process of an exemplary 3D NAND memory device 100 according to embodiments of the present disclosure. Among FIGS. 1-9, cross-sectional views are in a Y-Z plane and top views are in an X-Y plane. As shown in FIG. 1, the 3D NAND memory device 100 includes a substrate 110.

In some embodiments, the substrate 110 may include a single crystalline silicon layer. In some other embodiments, the substrate 110 may include a semiconductor material, such as germanium (Ge), silicon-germanium (SiGe), silicon carbide (SiC), silicon-on-insulator (SOI), germanium-on-insulator (GOI), polysilicon, a Group III-V compound such as gallium arsenide (GaAs) or indium phosphide (InP), etc. In some other embodiments, the substrate 110 may include an electrically non-conductive material such as glass, a plastic material, or a ceramic material. As an example, the substrate 110 includes an undoped or lightly doped single crystalline silicon layer. In some other embodiments, the substrate 110 may be doped differently with p-type or n-type dopants. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate.

In some embodiments, a top portion of the substrate 110 may be doped by n-type dopants via ion implantation and/or diffusion to form a doped region (not shown). The dopants of the doped region may include, for example, phosphorus (P), arsenic (As), and/or antimony (Sb). A cover layer (not shown) may be deposited over the doped region. The cover layer may be a sacrificial layer and may include a single layer, a multi-layer, or a suitable composite layer. For example, the cover layer may include one or more of silicon oxide layer and silicon nitride layer. The cover layer may be deposited by chemical vapor deposition (CVD), physical vapor deposition (PVD), atomic layer deposition (ALD), or a combination thereof. In some other embodiments, the cover layer may include another material such as aluminum oxide.

Over the cover layer, a sacrificial layer (not shown) may be deposited. The sacrificial layer may include a dielectric material, a semiconductor material, or a conductive material. For example, the sacrificial layer may be single crystalline silicon or polysilicon, which may be deposited by a CVD and/or PVD process. An exemplary material for the sacrificial layer is polysilicon.

After the polysilicon sacrificial layer is formed, a layer stack 140 may be formed. The layer stack 140 includes multiple pairs of a first layer 141 and a second layer 142, e.g., the first layer 141 and the second layer 142 are stacked alternately over each other. For example, the layer stack may include 64 pairs, 128 pairs, or more than 128 pairs of the first and second layers 141 and 142.

In some embodiments, the first layer 141 includes a first dielectric material and the second layer 142 includes a second dielectric material that is different from the first dielectric material. The alternating first and second layers 141 and 142 may be deposited via CVD, PVD, ALD, or a combination thereof. Exemplary materials for the first and second layers 141 and 142 include silicon oxide and silicon nitride, respectively. The silicon oxide layer may be used as an isolation layer and the silicon nitride layer may be used as a sacrificial layer. The sacrificial layer may be subsequently etched out and replaced by a conductive material layer or a conductor layer that includes an electrically conductive material.

Figure 2:
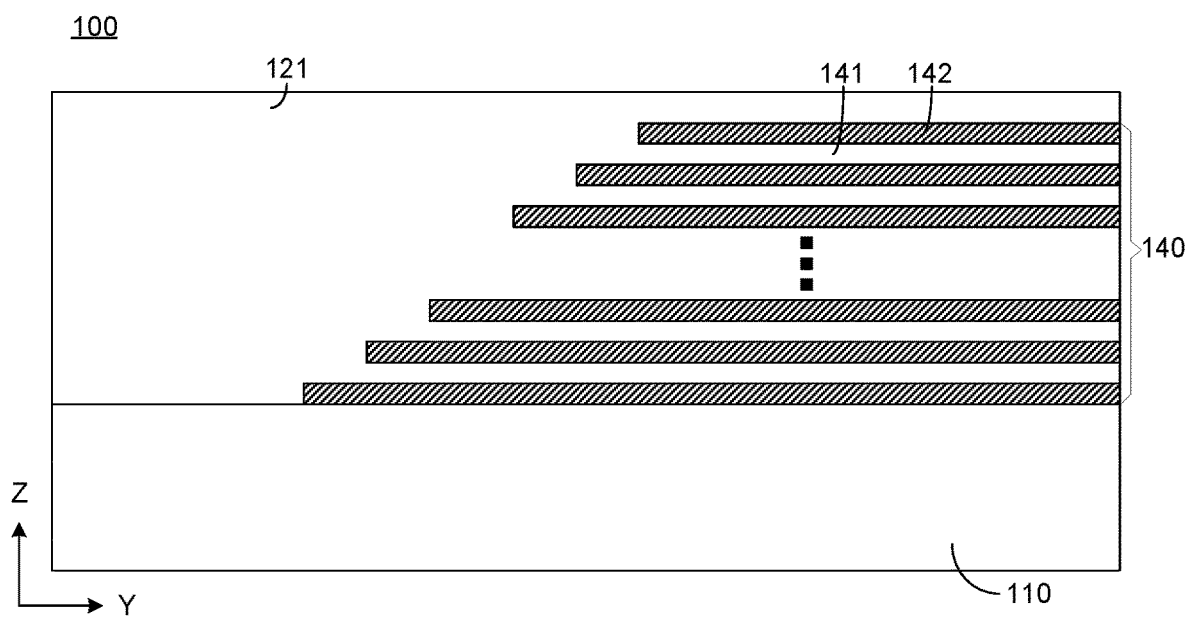

Referring to FIG. 2, a staircase structure may be formed based on the layer stack 140 by a staircase formation process. Any suitable etch process, including dry etch and/or wet etch processes, may be used in the staircase formation process. The layer stack 140 may be trimmed by the suitable etch process to form the staircase structure. For example, the height of the staircase structure of the layer stack 140 may increase in a stepwise manner along the Y direction as shown in FIG. 2. A dielectric layer 121 is formed to cover the staircase structure.

Figure 3:
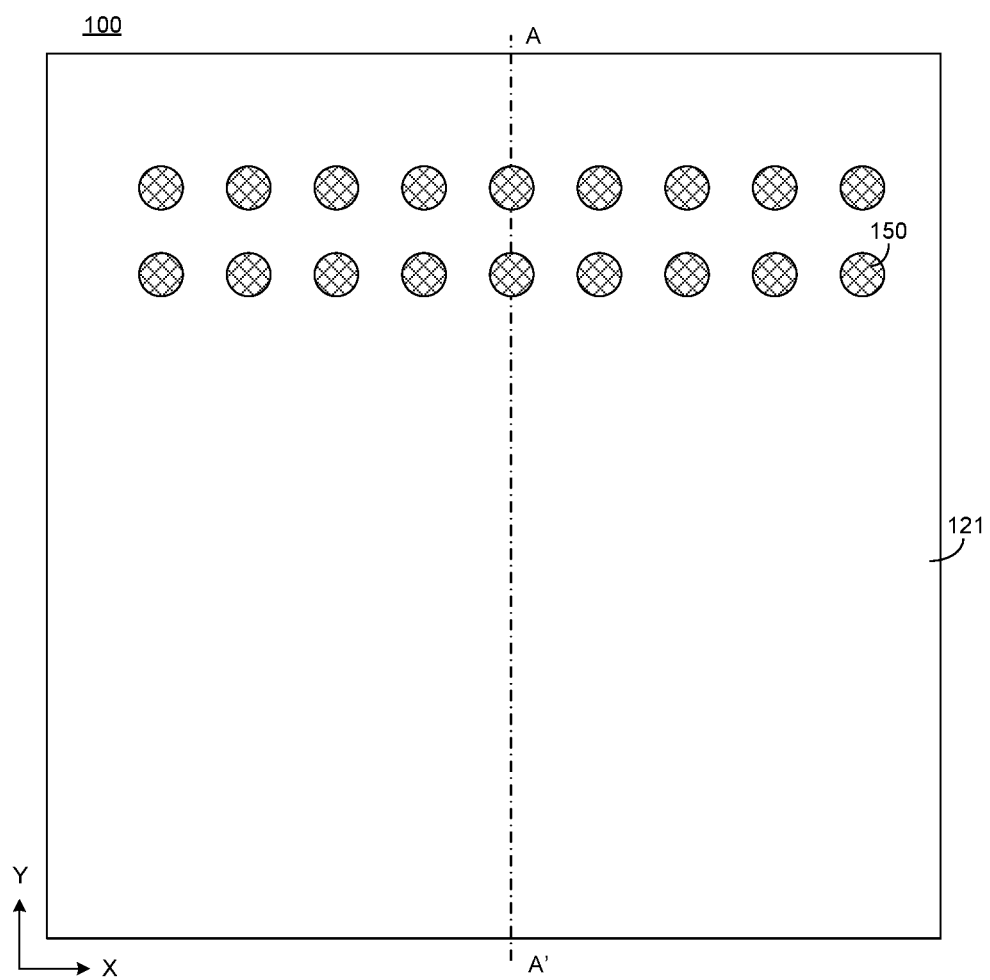
FIGS. 3 and 4 illustrate schematically a top view and a cross-sectional view of the 3D NAND memory device shown in FIG. 2 after channel holes are formed according to embodiments of the present disclosure.
Figure 4:
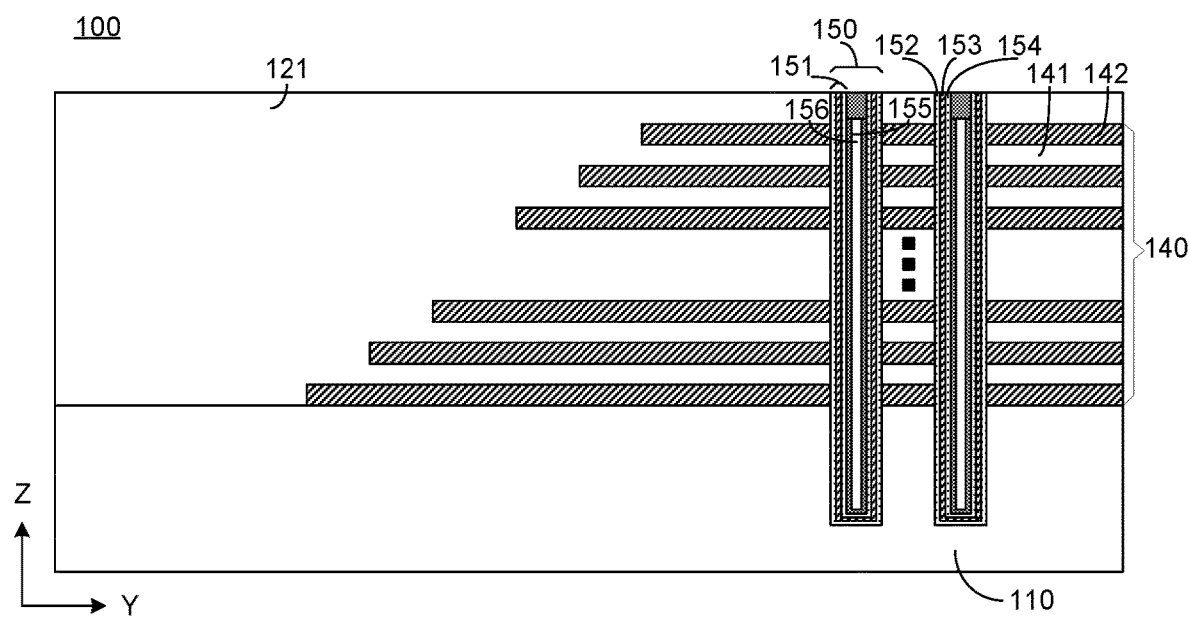

FIGS. 3 and 4 schematically show a top view and a cross-sectional view of the 3D NAND memory device 100 after channel holes 150 are formed and then filled with layer structures according to embodiments of the present disclosure. The quantity, dimension, and arrangement of the channel holes 150 shown in FIGS. 3 and 4 and in other figures in the present disclosure are only exemplary and for description purposes, although any suitable quantity, dimension, and arrangement may be used for the disclosed device 100 according to various embodiments of the present disclosure.

The channel holes 150 are configured to extend in the Z direction or in a direction approximately perpendicular to the substrate 110 and form an array of a predetermined pattern in the X-Y plane. The cross-sectional view shown in FIG. 4 is taken along a line AA' of FIG. 3. FIG. 4 only illustrates some of the channel holes 150 of FIG. 3 that are in the cross section in the Y-Z plane.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer, the cover layer, and partially penetrates the doped region. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trap layer 153 on a surface of the blocking layer 152 to store charges during an operation of the 3D NAND memory device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-K dielectric material such as aluminum oxide or hafnium oxide, another wide bandgap material, etc. The charge trap layer 153 may include one or more layers that may include one or more materials. The materials for the charge trap layer 153 may include polysilicon, silicon nitride, silicon oxynitride, nanocrystalline silicon, another wide bandgap material, etc. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, another wide bandgap material, etc.

In some embodiments, the functional layer 151 may include an oxide-nitride-oxide (ONO) structure. In some other embodiments, however, the functional layer 151 may have a structure different from the ONO configuration. For example, the functional layer 151 may include a silicon oxide layer, a silicon nitride layer, and another silicon oxide layer.

As shown in FIG. 4, the blocking layer 152 may be, e.g., a silicon oxide layer deposited on the sidewall of the channel hole 150. The charge trap layer 153 may be, e.g., a silicon nitride layer deposited on the blocking layer 152. The tunnel insulation layer 154 may be, e.g., another silicon oxide layer deposited on the charge trap layer 153. A channel layer 155, also referred to as a "semiconductor channel", may be, e.g., a polysilicon layer deposited on the tunnel insulation layer 154. In some other embodiments, the channel layer 155 may include amorphous silicon. Like the channel holes, the channel layers 155 also extend through the layer stack 140 and into the doped region. As shown in FIG. 4, a portion of each functional layer 151 is configured between a portion of one of the first and second layers 141 and 142 and a portion of one of the channel layers 155. The blocking layer 152, the charge trap layer 153, the tunnel insulation layer 154, and the channel layer 155 may be deposited by, e.g., CVD, PVD, ALD, or a combination of two or more of these processes. The channel holes 150 may be filled by an oxide material 156 after the channel layers 155 are formed.

In the process described above, the channel holes 150 are etched after the staircase structure is formed. In some other embodiments, the channel holes 150 may be formed before the staircase formation process. For example, after the layer structure 140 is fabricated as shown in FIG. 1, channel holes 150 may be formed and then the functional layer 151 and the channel layer 155 may be deposited. After the channel holes 150 are filled with the oxide material 156, the staircase formation process may be performed to form the staircase structure as shown in FIG. 4.

In some other embodiments, the layer stack 140 may be referred to as the first layer stack. After the layer stack 140 (i.e., the first layer stack) in the staircase form is formed and the channel holes 150 with the functional layers 151 and the channel layers 155 are fabricated, a second layer stack (not shown) in the staircase form may be formed over the layer stack 140. Channel holes that are aligned with the channel holes 150 may be formed, and the functional layers and channel layers may be deposited in the second layer stack. Each channel layer of the second layer stack may be aligned with and electrically connected to a corresponding channel layer 155. In a similar manner, a third or more layer stacks may be formed over the second layer stack. As such, multiple layer stacks may be formed and integrated over the substrate 110 and the memory capacity of the 3D NAND memory device 100 may be multiplied. In the description below, the layer stack 140 is used to illustrate structures and fabrication method of the 3D NAND memory device 100.

Figure 5:
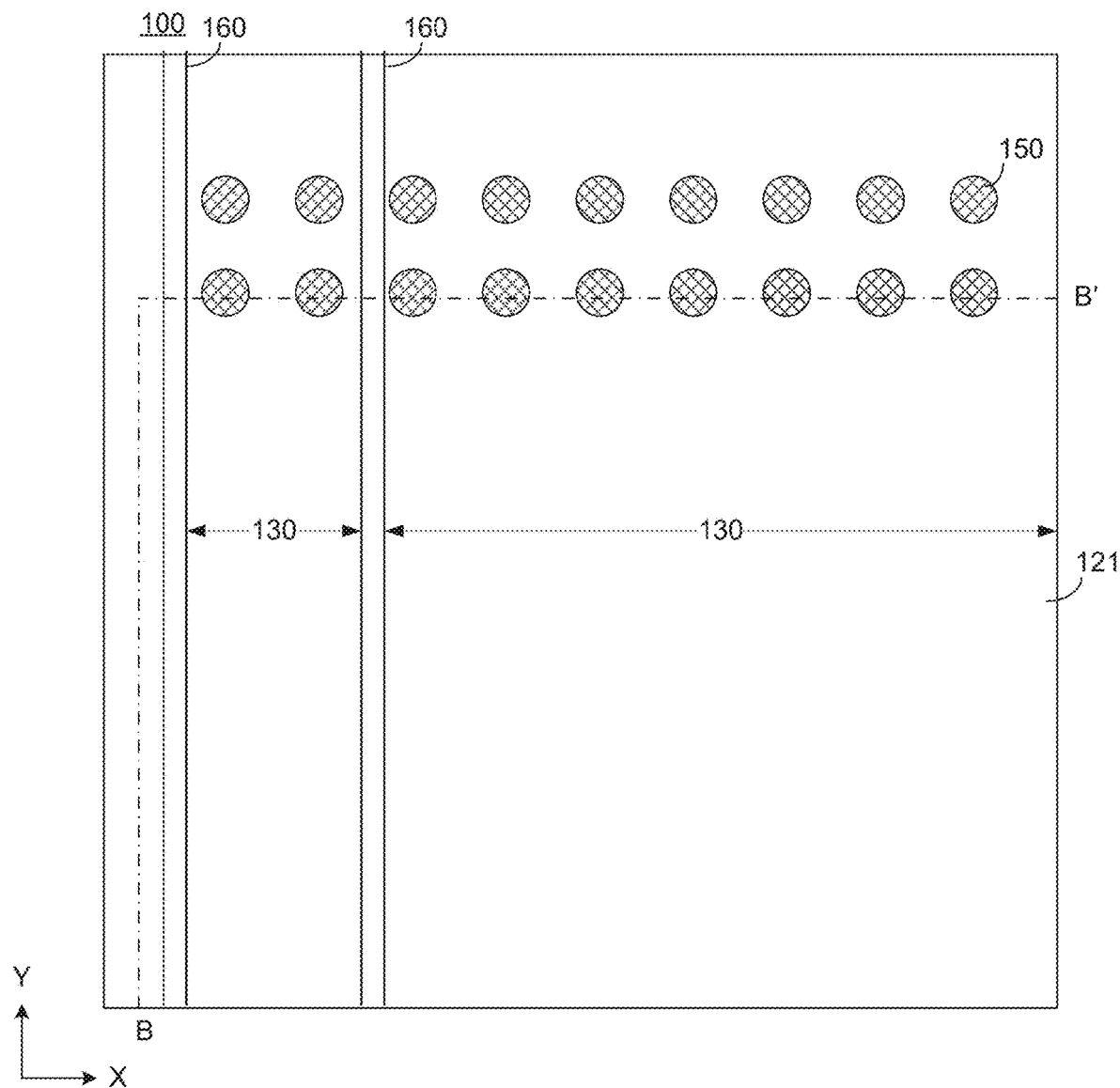
FIGS. 5 and 6 illustrate schematically a top view and a cross-sectional view of the 3D NAND memory device shown in FIGS. 3 and 4 after gate line slit structures are formed according to embodiments of the present disclosure.
Figure 6:
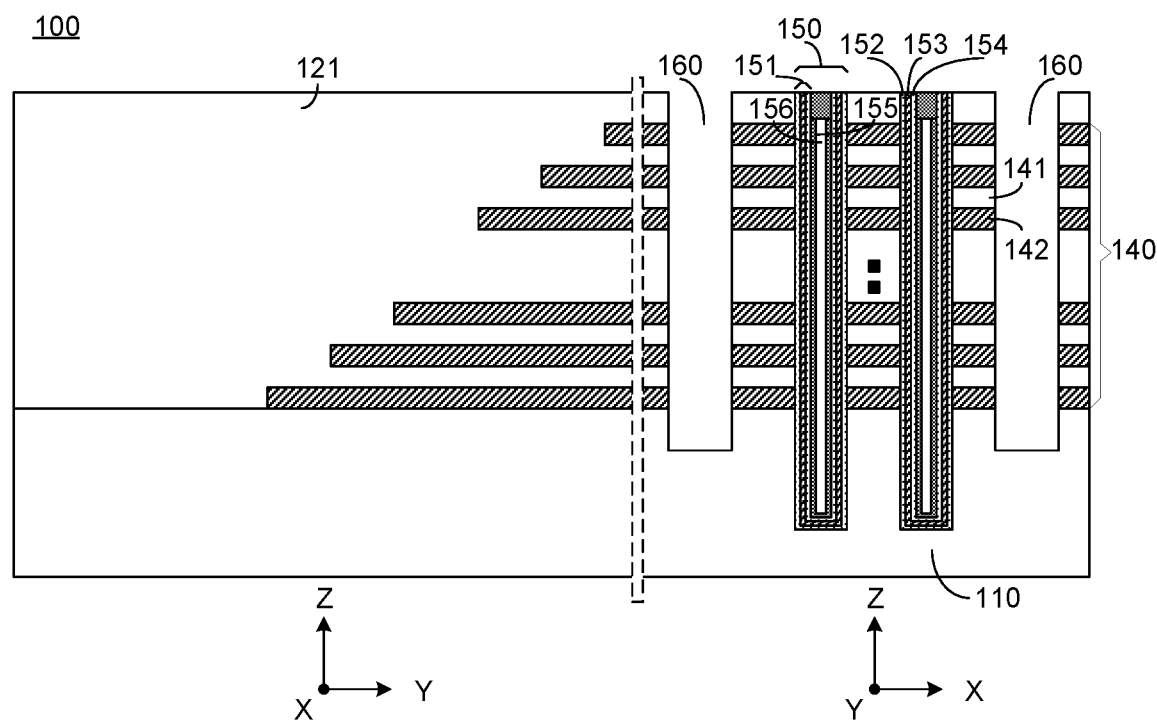

FIGS. 5 and 6 schematically show a top view and a cross-sectional view of the 3D NAND memory device 100 after gate line slits 160 are formed according to embodiments of the present disclosure. The cross-sectional view shown in FIG. 6 is taken along a line BB' of FIG. 5. The 3D NAND memory device 100 may have a great number of NAND memory cells configured in the layer stack 140 or residing in the layer stack 140. The layer stack 140 may be divided into multiple memory blocks 130. In some embodiments, NAND memory cells belonging to a memory block 130 may be reset together in a block erase operation. The channel holes shown in FIG. 5 may form an exemplary memory block that is separated from other memory block regions (not shown) by the gate line slits 160 which may also be referred to as gate line slit structures 160. For example, a pair of the gate line slits 160 shown in FIGS. 5 and 6 defines a block 130 there-between. In some other embodiments, one or more additional gate line slits may be formed between a pair of the gate line slits 160.

The gate line slits 160 may be formed by, e.g., a dry etch process or a combination of dry and wet etch processes. As shown in FIG. 6, the gate line slits 160 may extend through the layer stack 140 and reach or partially penetrate the sacrificial layer in the Z direction or in a direction approximately perpendicular to the substrate 110. As such, at the bottom of the gate line slit 160, the sacrificial layer is exposed. Then, spacer layers (not shown) may be deposited on the sidewall and bottom of the gate line slits 160 by CVD, PVD, ALD, or a combination of two or more of these processes. The spacer layers are configured to protect the first and second layers 141 and 142 and may include, for example, silicon oxide and silicon nitride.

After the spacer layers are deposited, a selective etch process may be performed such that parts of the spacer layers at the bottom of the slits are removed by dry etch or a combination of dry etch and wet etch. As such, the sacrificial layer is exposed again. Then another selective etch process, e.g., a selective wet etch process, may be performed to remove the sacrificial layer. Removal of the sacrificial layer creates a cavity and exposes the cover layer and bottom portions of the blocking layers 152 formed in the channel holes 150. Next, multiple selective etch processes, e.g., multiple selective wet etch processes, may be performed to remove the exposed portions of the blocking layer 152, the charge trap layer 153, and the tunnel insulation layer 154 consecutively, which exposes bottom side portions of the channel layer 155.

In some embodiments, the cover layer may be silicon oxide. Then, the cover layer may be removed when the bottom portions of the functional layer 151 are etched away. In some other embodiments, the cover layer may include a material other than silicon oxide or silicon nitride. Then, the cover layer may be removed by one or more additional selective etch processes. Removal of the cover layer exposes the top surface of the doped region.

Thus, after the etch processes described above, the doped region and side portions of the channel layers 155 close to the bottom of the channel hole 150 are exposed in the cavity left by etching away the sacrificial layer and the cover layer. The cavity may be filled by a semiconductor material, e.g., polysilicon, to form a semiconductor layer (not shown), e.g., by a CVD and/or PVD deposition process. The semiconductor layer may be n-doped. The semiconductor layer may be formed on the exposed surface of the doped region and on sidewalls or side portions of the channel layers 155, and may be electrically connected to the doped region and the channel layers 155.

In some other embodiments, a selective epitaxial growth process may be performed such that a layer of single crystalline silicon is grown on the exposed surface of the doped region and a polysilicon layer is grown on the exposed surface of the channel layer 155. As such, the semiconductor layer may include adjoined layers of single crystalline silicon and polysilicon.

Figure 7:
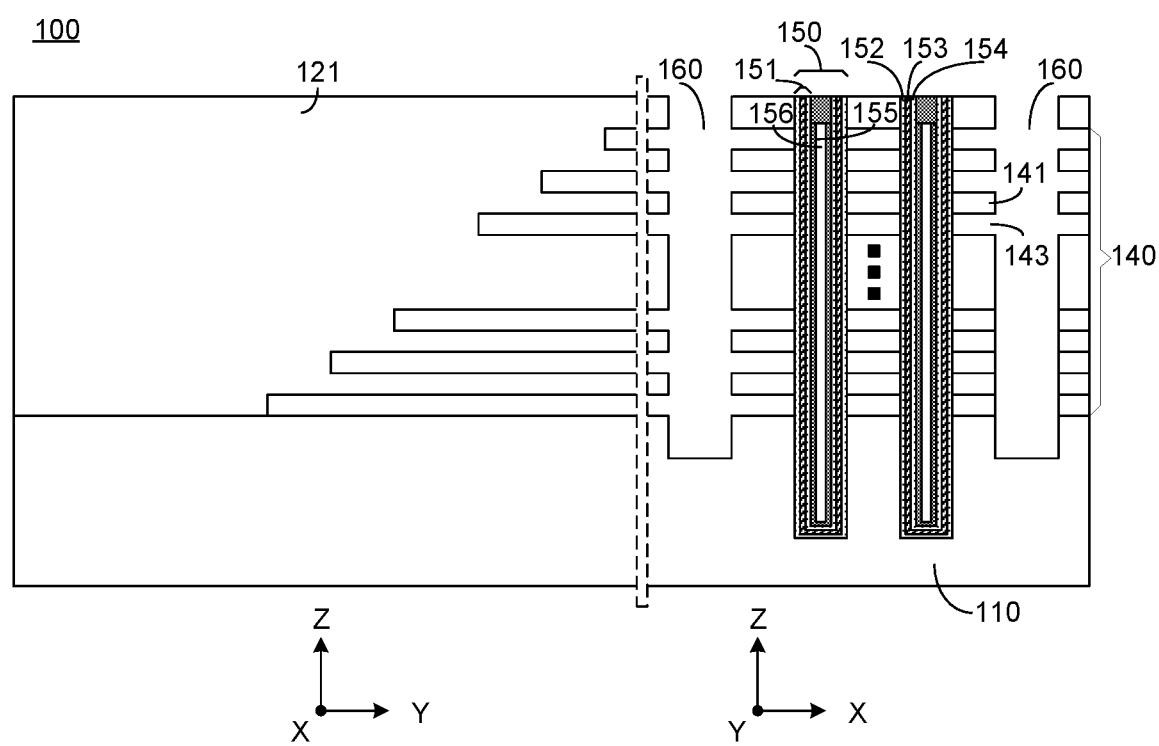
FIGS. 7 and 8 illustrate schematically cross-sectional views of the 3D NAND memory device shown in FIGS. 5 and 6 after second layers are removed and a high-K material layer is formed according to embodiments of the present disclosure.

When the bottom parts of the functional layer 151 and the cover layer are etched, some spacer layers may be etched away and the rest of the spacer layers may remain on the sidewall of gate line slits 160 to protect the first and second layers 141 and 142. After the semiconductor layer is formed, the remaining spacer layers may be removed in a selective etch process, e.g., a selective wet etch process. In some embodiments, the innermost spacer layer, which is in contact with the sidewall, is silicon nitride. Because the second layers 142 (also known as sacrificial layer) are also silicon nitride layers, the innermost spacer layer and the silicon nitride layers 142 may be removed together during the etch process, leaving cavities 143 between the first layers 141 (also known as oxide layers), as shown in FIG. 7.

Figure 8:
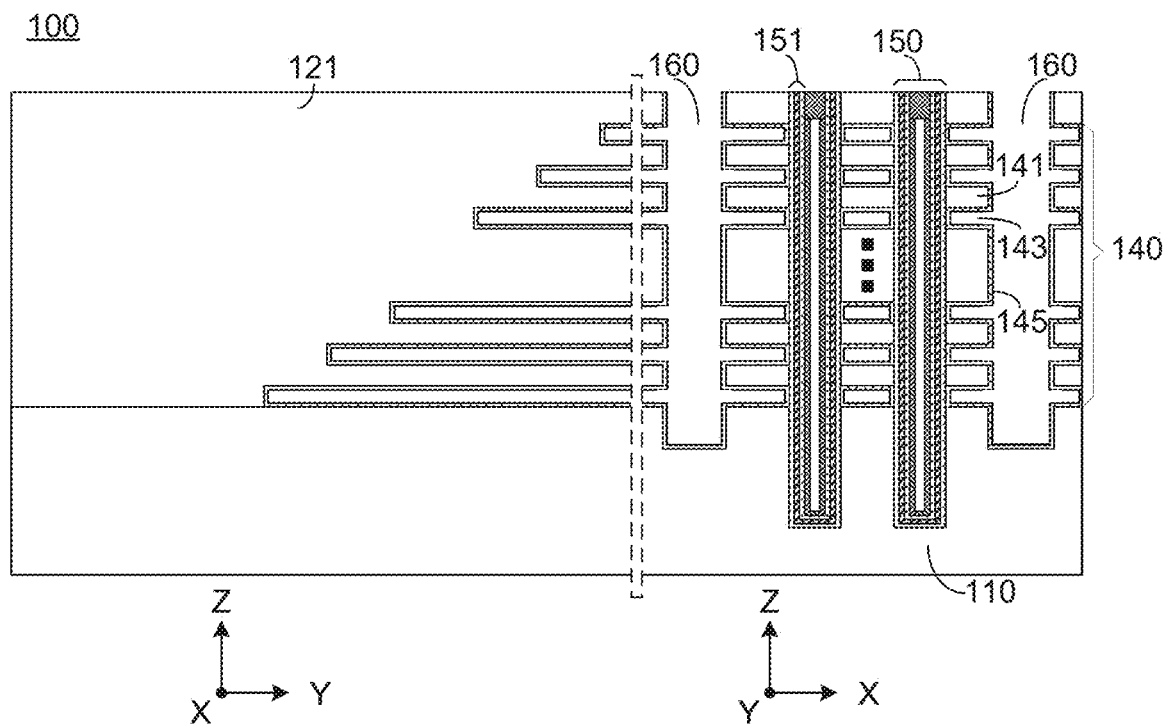
Figure 9:
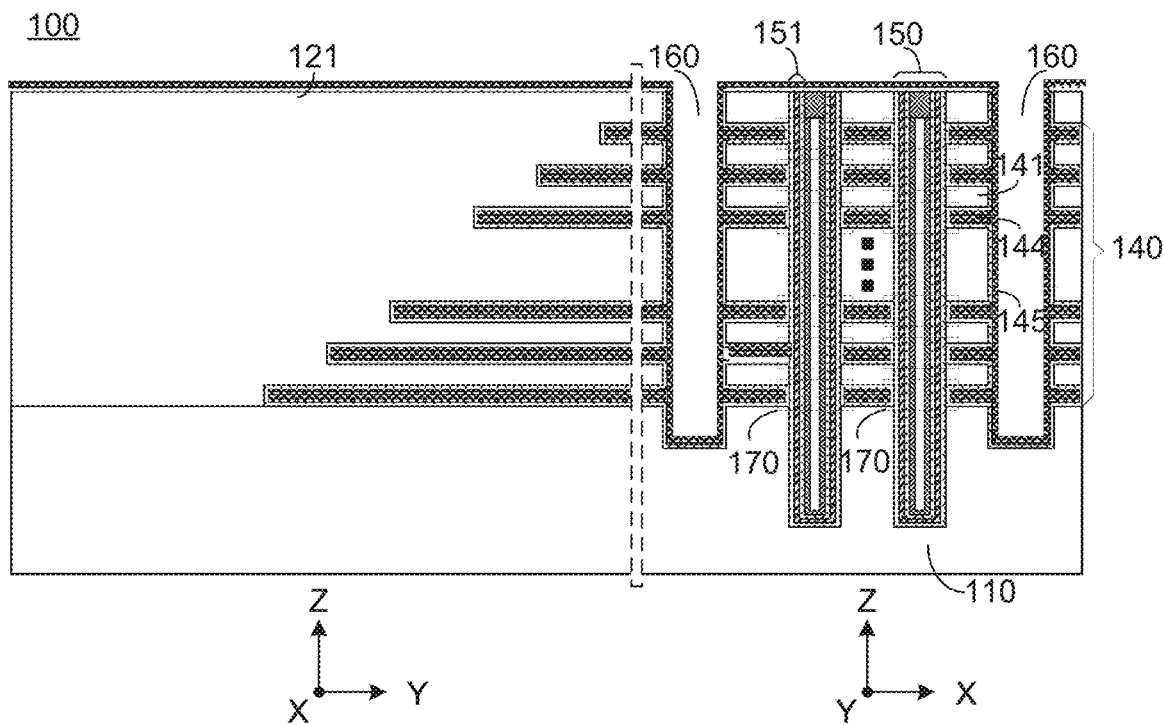
FIG. 9 illustrates a schematically cross-sectional view of the 3D NAND memory device after the gate line slit structures are formed in the layer stack according to embodiments of the present disclosure.

Thereafter, an electrically conductive material such as tungsten (W) may be grown to fill the cavities 143 left by the removal of the second layers 142, forming conductor layers (also known as conductive material layer) 144 between the first layers 141. That is, the conductor layers 144 replace the second layers 142 and the layer stack 140 now includes alternating first layers 141 and conductor layers 144, as shown in FIG. 9. In some embodiments, before metal W is deposited in the cavities 143, a dielectric layer 145 of a high-K dielectric material (also known as high-K material layer) such as aluminum oxide may be deposited, as shown in FIG. 8, followed by deposition of a layer of an electrically conductive material such as titanium nitride (not shown). In some embodiments, the high-K material layer 145 is made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof. Then metal W may be deposited to form the conductor layers 144. CVD, PVD, ALD, or a combination of two or more of these processes may be used in the deposition processes. In some other embodiments, another conductive material, such as cobalt (Co), copper (Cu), aluminum (Al), doped silicon, or any combination thereof, may be used to form the conductor layers 144.

A portion of each functional layer 151 in a channel hole 150 is between a portion of one of the conductor layers 144 and a portion of the channel layer 155 in the channel hole 150. Each conductor layer 144 is configured to electrically connect one or more rows of NAND memory cells 170 along the Y direction or in the X-Y plane and is configured as a word line for the 3D NAND memory device 100. The channel layer 155 formed in the channel hole 150 is configured to electrically connect a column or a string of NAND memory cells 170 along the Z direction and configured as a bit line for the 3D NAND memory device 100. As such, a portion of the functional layer 151 in the channel hole 150 in the X-Y plane, as a part of a NAND memory cell 170, is arranged between a conductor layer 144 and a channel layer 155, i.e., between a word line and a bit line. A portion of the conductor layer 144 that is around a portion of the channel hole 150 functions as a control gate or gate electrode for a NAND memory cell 170. The 3D NAND memory device 100 depicted in FIG. 9 can be considered as including a 2D array of strings of NAND cells 170 (such a string is also referred to as a "NAND string"). Each NAND string contains multiple NAND memory cells 170 and extends vertically toward the substrate 110. The NAND strings form a 3D array of the NAND memory cells 170.

After the conductor layer 144 are formed, the metal W is removed by an etch process, which includes a dry etch process or a combination of dry and wet etch processes, from the gate line slits 160. The metal W is supposed to be completely removed from the gate line slits 160. In the existing method of fabricating the 3D NAND memory device 100, the metal W may not be completely removed from the sidewall and the bottom of the gate line slits 160, and some metal W may remain on the sidewall and the bottom of the gate line slits 160, causing leakage currents between adjacent conductor layers 144.

Figure 14:
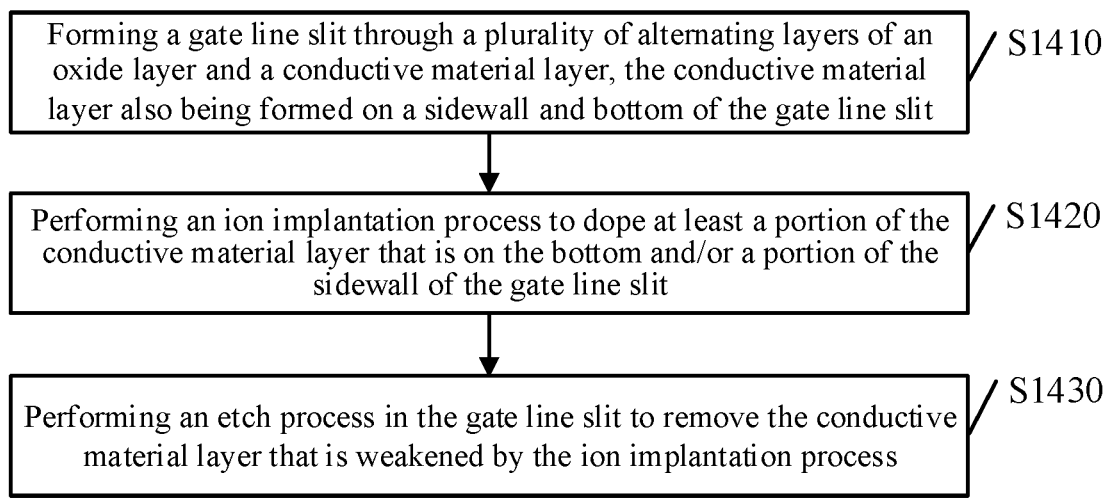
FIG. 14 illustrates a schematic flowchart of an exemplary method of forming a gate line slit in the 3D NAND memory device according to embodiments of the present disclosure.

The present disclosure provides a method of forming a gate line slit while completely removing the metal W or the conductive material layer from the sidewall and the bottom of the gate line slit. FIG. 14 illustrates a schematic flowchart of an exemplary method of forming a gate line slit according to embodiments of the present disclosure. As shown in FIG. 14, the method of forming the gate line slit includes the following processes.

At S1410, a gate line slit is formed through a plurality of alternating layers of an oxide layer and a conductive material layer. The conductive material layer is also formed on a sidewall and a bottom of the gate line slit.

In some embodiments, referring to FIG. 6, the gate line slit 160 is formed in the layer stack 140. The layer stack 140 includes multiple pairs of a first layer 141 and a second layer 142 stacked alternately over each other. The first layer 141 includes a first dielectric material. The second layer 142 includes a second dielectric material that is different from the first dielectric material. In some embodiments, the first layer 141 includes silicon oxide, and the second layer 142 includes silicon nitride. In some embodiments, the first layer 141 is an oxide layer, and the second layer 142 is a sacrificial layer.

In some embodiments, referring to FIG. 7, the second layer 142 in each pair of the multiple pairs of the first layer 141 and the second layer 142 is removed to form a cavity 143.

In some embodiments, referring to FIG. 8, a dielectric layer 145 of a high-k dielectric material such as aluminum oxide may be deposited, followed by deposition of a layer of an electrically conductive material such as titanium nitride (not shown). The dielectric layer 145 of the high-K material (also known as the high-K material layer) covers the sidewall and the bottom of the gate line slit 160. In some embodiments, the high-K material layer 145 includes an aluminum oxide sub-layer and a titanium nitride sub-layer. Then a conductive material such as tungsten (W) may be deposited to form the conductor layers 144 as shown in FIG. 9. CVD, PVD, ALD, or a combination of two or more of these processes may be used in the deposition processes. In some other embodiments, another conductive material, such as cobalt (Co), copper (Cu), aluminum (Al), doped silicon, or any combination thereof, may be used to form the conductor layers 144. The conductive material also covers the dielectric layer 145 on the sidewall and the bottom of the gate line slit 160.

In some embodiments, the oxide layer is made of silicon oxide. The sacrificial layer is made of silicon nitride. The high-K material layer is made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

In some embodiments, the high-K material layer includes an aluminum oxide sub-layer and a titanium nitride sub-layer.

In some embodiments, the conductive material layer is made of a material including tungsten (W), cobalt (Co), copper (Cu), aluminum (Al), doped silicon, or a combination thereof.

Referring back to FIG. 14, at S1420, an ion implantation process is performed to dope at least a portion of the conductive material layer that is on the bottom and/or a portion of the sidewall of the gate line slit. The ion implanted conductive material layer can be removed more easily.

In some embodiments, the ion implantation process includes forming an ion beam to bombard the conductive material layer on the sidewall and the bottom of the gate line slit 160. The high energy ions penetrate into the conductive material layer and causes damages to the crystal structure of the conductive material layer. To more effectively penetrate into the conductive material layer, the ion beam is controlled to aim at the conductive material layer on the sidewall of the gate line slit 160 with an angle. Because the gate line slit 160 has a cylindrical shape, the ion beam is tilted with respect to a direction perpendicular to a top surface of the layer stack 140. Further, the cylinder-shaped gate line slit 160 cuts through the layer stack 140 to separate the alternating layers of the oxide layer 141 and the conductive layer 144. The ion beam is controlled to focus on the bottom and two sides of the sidewall of the gate line slit 160 where side portions of the oxide layer 141 and the conductive material layer 144 are located.

Figure 10A:
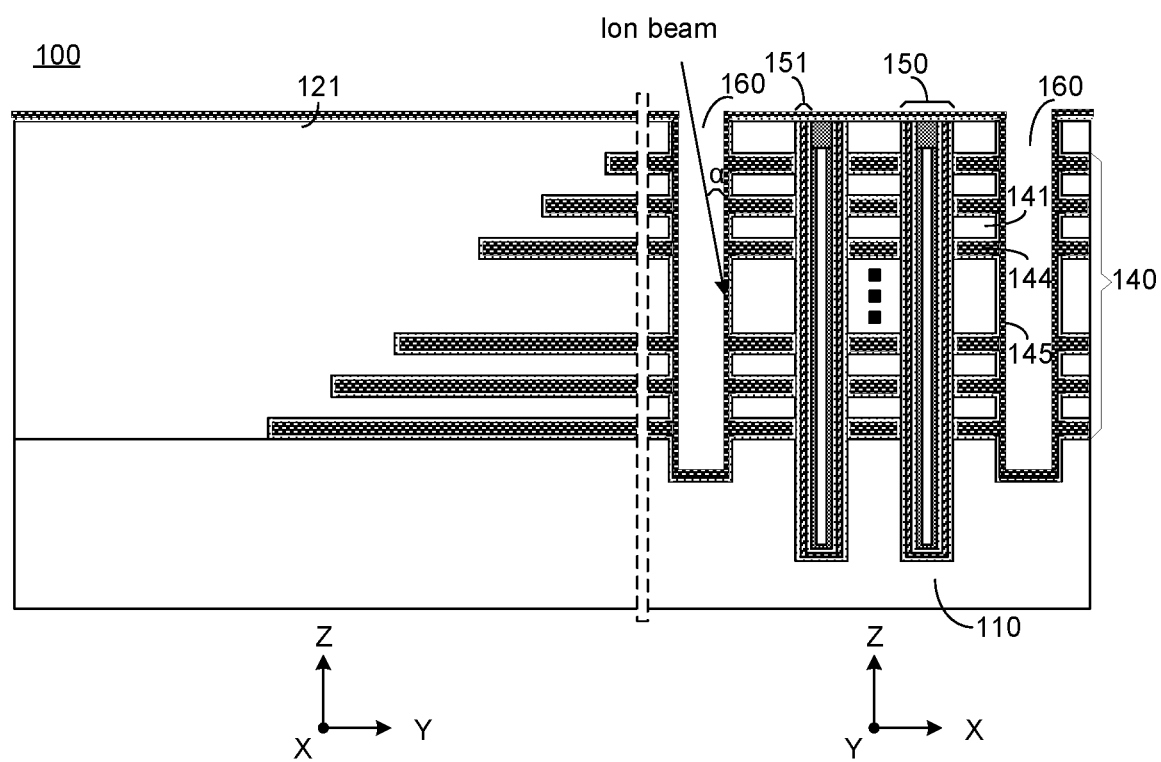
FIGS. 10A-10C illustrate schematically cross-sectional views of the 3D NAND memory device in different parts of the ion implantation process according to embodiments of the present disclosure.
Figure 10B:
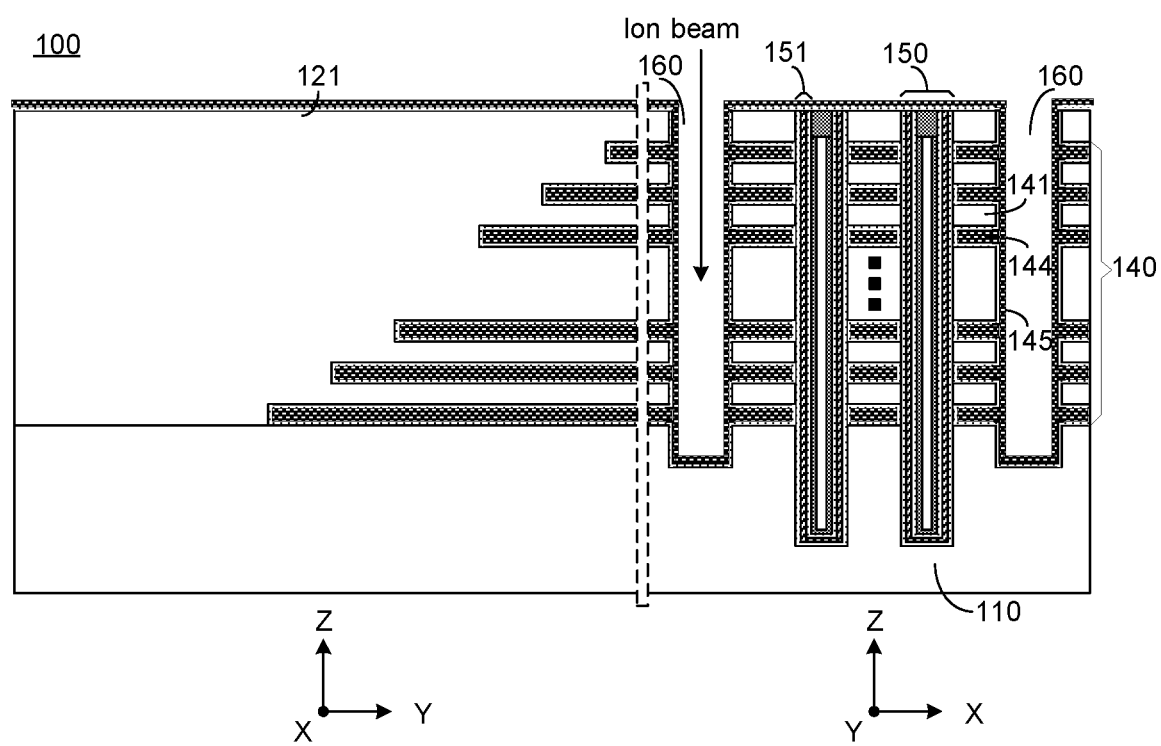
Figure 10C:
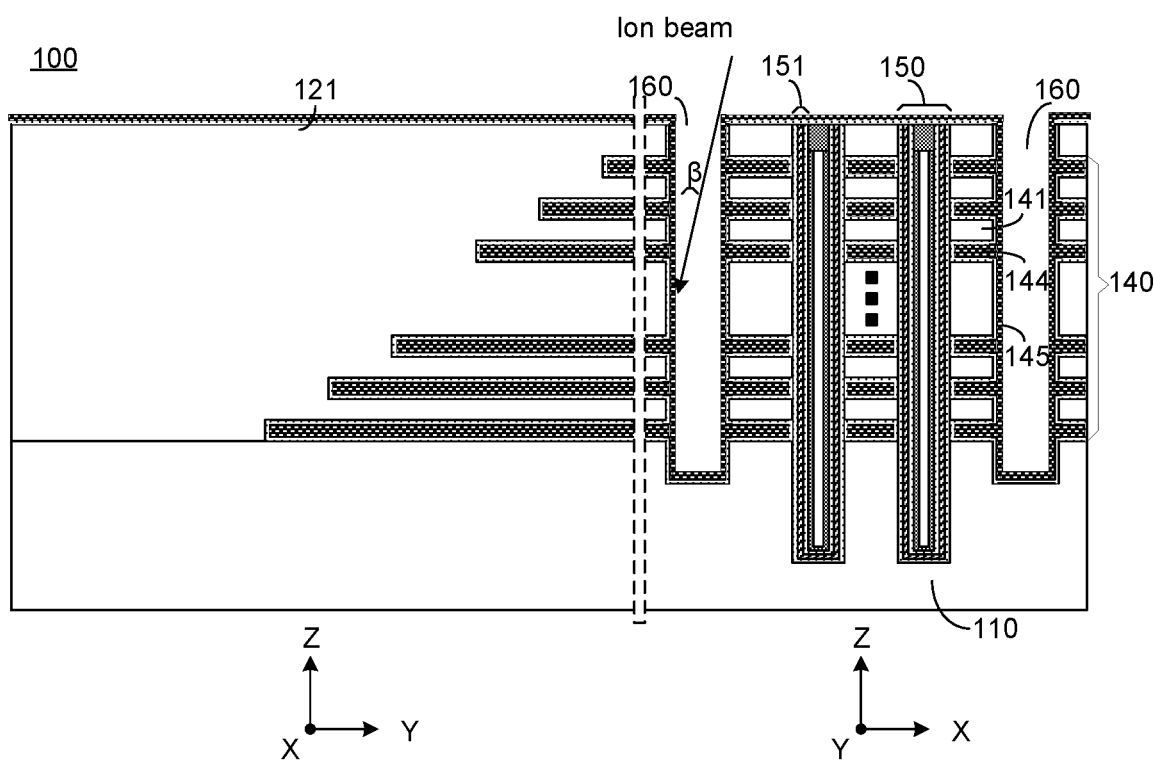

In some embodiments, in a first part of the ion implantation process, the ion beam is controlled to aim at a first angle α with respect to the direction perpendicular to the surface of the layer stack 140 toward a first side of the sidewall where the side portions of the oxide layer 141 and the conductive material layer 144 are located, as shown in FIG. 10A. In a second part of the ion implantation process, the ion beam is controlled to aim directly at the bottom of the gate line slit 160. In a third part of the ion implantation process, the ion beam is controlled to aim at a second angle β with respect to the direction perpendicular to the surface of the layer stack toward a second side of the sidewall where the side portions of the oxide layer 141 and the conductive material layer 144 are located. The first angle α substantially equals to the second angle β, and the first side is opposite to the second side. The first angle α and the second angle β can be adjusted approximately between 0 and 30 degrees.

In some embodiments, ions used in the ion implantation process include phosphorus (P) ions, arsenic (As) ions, carbon (C) ions, or boron (B) ions. Dosage of the ions used in the high energy ion implanting process is approximately between $10^{15}$ and $10^{17}$ ions/cm$^2$. An energy level of the ions used in the ion implantation process is approximately between 15 keV and 60 keV. For example, the ions used in the ion implantation process are phosphorus (P) ions, the dosage of the ions used in the ion implantation process is approximately $10^{16}$ ions/cm$^2$, and the energy level of the ions used in the ion implantation process is approximately 30 keV.

Referring back to FIG. 14, at S1430, an etch process is performed in the gate line slit to remove the conductive material layer that is weakened by the ion implantation process.

In some embodiments, the etch process is performed to remove the ion implanted conductive material layer from the sidewall and the bottom of the gate line slit 160. Because the conductive material layer on the sidewall and the bottom of the gate line slit 160 is and weakened by the ion implantation process, the ion implanted conductive material layer on the sidewall and the bottom of the gate line slit 160 can be removed more easily and more completely.

In some embodiments, when the gate line slit is formed through the layer stack, the conductive material layer is further formed on a top surface of the layer stack. The etch process further removes the conductive material layer on the top surface of the layer stack.

Figure 11:
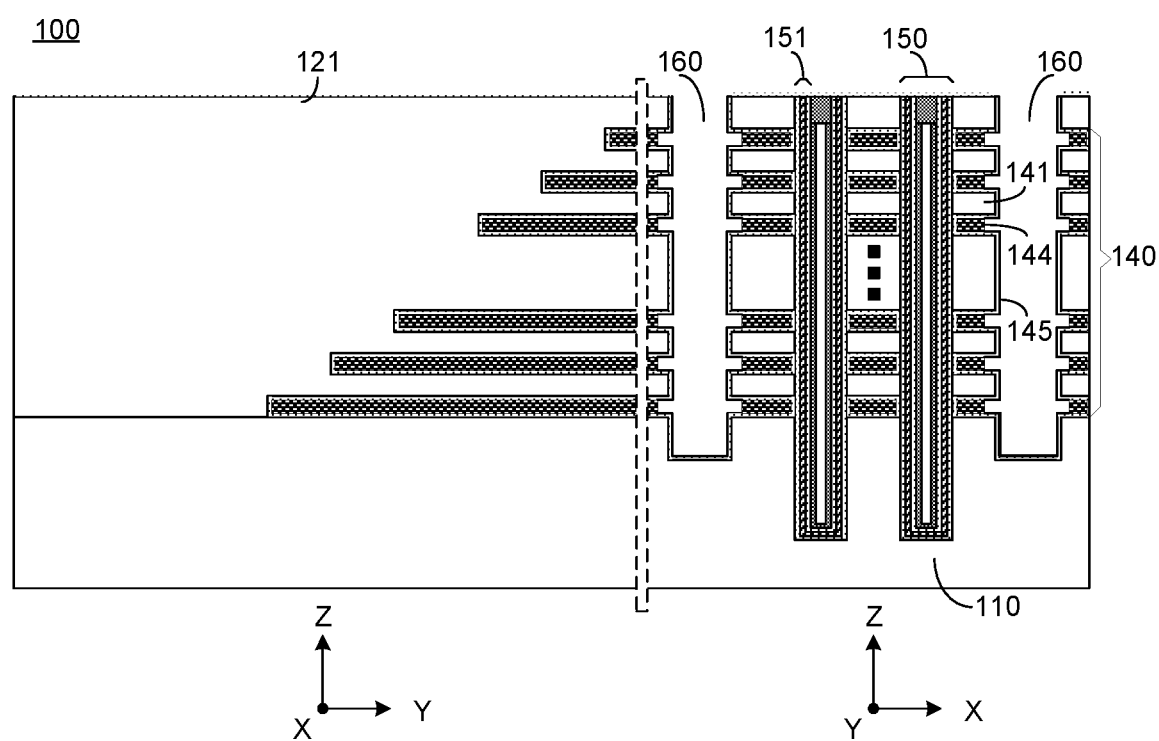
FIG. 11 illustrates a schematically cross-sectional view of the 3D NAND memory device after an etch process is performed according to embodiments of the present disclosure.

As shown in FIG. 11, after the etch process is performed, the conductive material layers 144 are recessed into the layer stack 140 from the gate line slit 160 to expose side portions of the oxide layers 141. The side portions of the oxide layer 141 are covered by the high-K material layer 145, which include a first portion of the high-K material layer 145 covering top and bottom surfaces at an end side of the oxide layer 141 and a second portion of the high-K material layer 145 on the sidewall of the gate line slit 160. Further, after the etch process is performed, small portions of the conductive material layer may remain on the sidewall and the bottom of the gate line slit 160. This is because the conductive material layer on the sidewall and the bottom of the gate line slit 160 has uneven thickness, and the etch process may be unable to completely remove thicker portions of the conductive material layer.

In some embodiments, the etch process includes a wet etch process, a dry etch process, or a combination thereof.

Further, a dry etch process is performed in the gate line slit to at least remove the high-K material layer at the bottom of the gate line slit, such that residues of the conductive material layer in the gate line slit are all removed.

Figure 12:
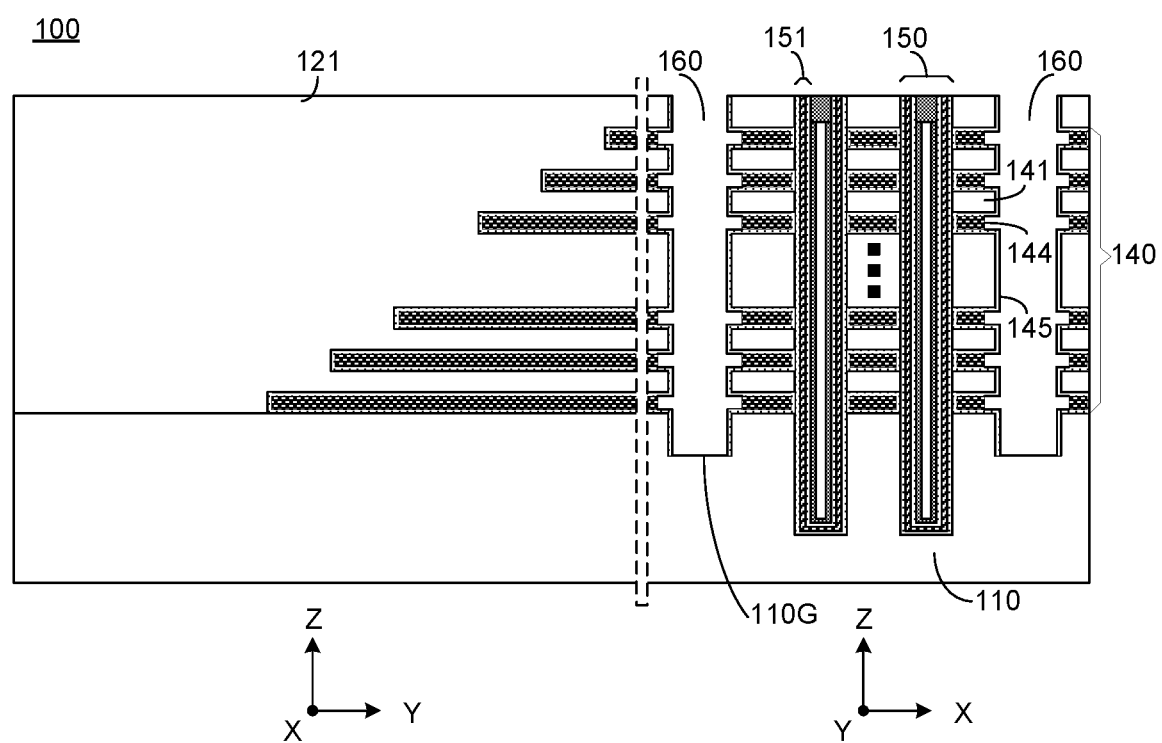
FIG. 12 illustrates a schematically cross-sectional view of the 3D NAND memory device after a dry etch process is performed according to embodiments of the present disclosure.

In some embodiments, as shown in FIG. 12, the dry etch process is performed to remove the high-K material layer at the bottom 110G of the gate line slit 160. The dry etch process also removes the high-K material layer on the top surface of the layer stack 140. Further, the dry etch process is performed to completely remove residues of the conductive material layer from the sidewall and the bottom of the gate line slit 160. The dry etch process may further remove a side portion of each oxide layer in the gate line slit 160.

Figure 13:
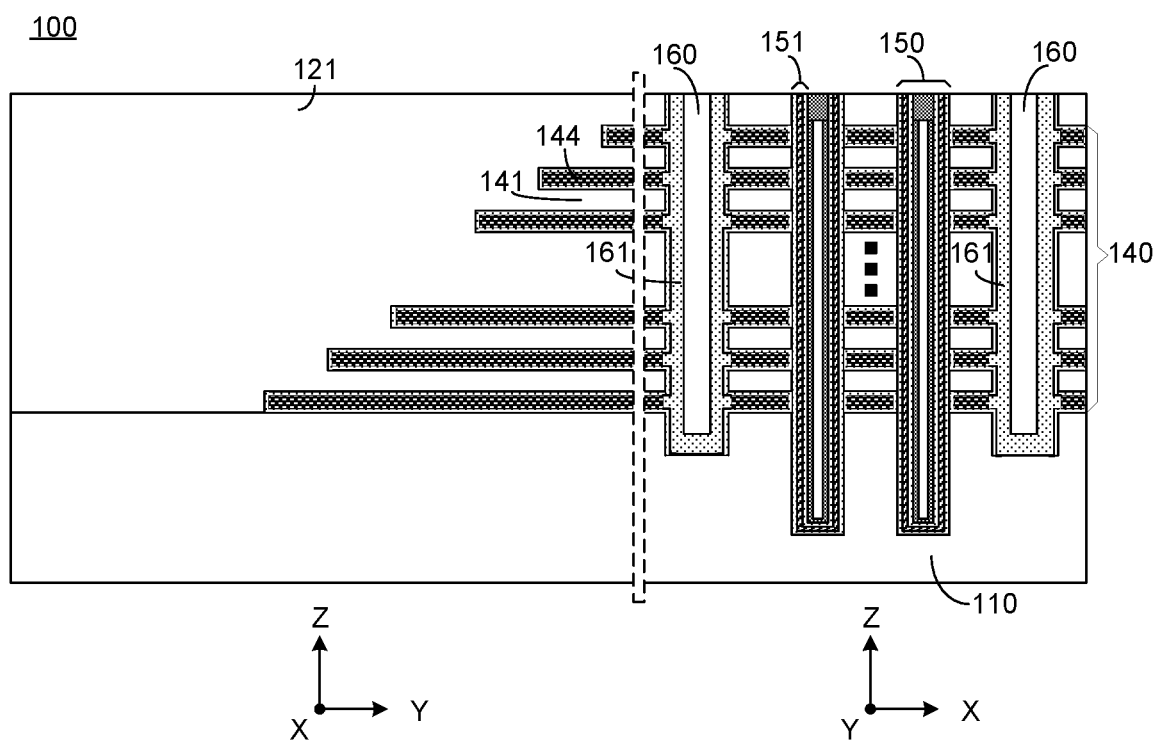
FIG. 13 illustrates a schematically cross-sectional view of the 3D NAND memory device after a spacer layer is formed according to embodiments of the present disclosure.

In some embodiments, as shown in FIG. 13, a spacer layer 161 is formed on the sidewall and the bottom of the gate line slit 160 after the dry etch process is performed in the gate line slit 160.

In some embodiments, the gate line slit 160 shown in FIGS. 6-14 has a cylinder shape. In some other embodiments, the gate line slit 160 has a frustum shape (not shown). An opening of the frustum-shaped gate line slit 160 is wider than the bottom of the gate line slit 160 adjacent to the substrate 110.

In the embodiments of the present disclosure, the gate line slit is formed while the conductive material layer is completely removed from the gate line slit. Thus, leakage currents are prevented between adjacent conductor layers in the layer stack.

The foregoing embodiments describe in detail the objective, the technical solution, and the beneficial effect of the present disclosure. The foregoing embodiments are only some of the embodiments of the present disclosure, which should not be used to limit the scope of present disclosure. Therefore, changes, equivalent replacements, and modifications made according to the claims of the present disclosure still fall within the scope of the present disclosure.

What is claimed is:

1. A method of forming a three-dimensional (3D) NAND memory device, comprising:
    forming a gate line slit through a plurality of alternating layers of an oxide layer and a conductive material layer, wherein the gate line slit extends along a first direction perpendicular to the alternating layers of the oxide layer and the conductive material layer and also extends along a second direction perpendicular to the first direction and is formed to separate memory cells into blocks, and the conductive material layer is further formed on a sidewall and a bottom of the gate line slit;
    performing an ion implantation process to dope at least a portion of the conductive material layer that is on the bottom and a portion of the sidewall of the gate line slit; and
    performing an etch process in the gate line slit to remove the conductive material layer that is weakened by the ion implantation process to at least remove a portion of the conductive material layer from between adjacent oxide layers, providing a recessed surface of the conductive material layer between the adjacent oxide layers and exposed to the gate line slit.

2. The method according to claim 1, further including:
    forming a spacer layer on the sidewall and the bottom of the gate line slit after the etch process is performed in the gate line slit, wherein the spacer layer further extends between adjacent oxide layers and over the recessed surface of the conductive material layer.

3. The method according to claim 1, wherein forming the gate line slit through the plurality of alternating layers of the oxide layer and the conductive material layer includes:
    forming the gate line slit through a layer structure at least including alternating layers of the oxide layer and a sacrificial layer;
    via the gate line slit, removing sacrificial layers from the layer structure to expose the oxide layers;
    forming a high-K material layer to cover exposed surfaces of the oxide layers and the bottom of the gate line slit; and
    forming additional different conductive material layers between adjacent oxide layers and over the high-K material layer.

4. The method according to claim 3, wherein:
    the oxide layer is made of silicon oxide;
    the sacrificial layers are made of silicon nitride; and
    the high-K material layer is made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

5. The method according to claim 4, wherein:
    the high-K material layer includes aluminum oxide and titanium nitride.

6. The method according to claim 3, wherein:
    the etch process also removes the high-K material layer from the top surface of the layer structure and the bottom of the gate line slit.

7. The method according to claim 1, wherein:
    the conductive material layer is made of a material including tungsten (W), cobalt (Co), copper (Cu), aluminum (Al), doped silicon, or a combination thereof.

8. The method according to claim 1, wherein performing the ion implantation process to dope at least the portion of the conductive material layer that is on the bottom and/or the portion of the sidewall of the gate line slit includes:
    forming an ion beam;
    in a first part of the ion implantation process, aiming the ion beam at a first angle with respect to a direction perpendicular to a surface of a layer stack toward a first side of the sidewall where side portions of the alternating layers of the oxide layer and the conductive material layer are located;
    in a second part of the ion implantation process, aiming the ion beam toward the conductive material layer on the bottom of the gate line slit; and
    in a third part of the ion implantation process, aiming the ion beam at a second angle with respect to the direction perpendicular to the surface of the layer stack toward a second side of the sidewall where side portions of the alternating layers of the oxide layer and the conductive material layer are located;
    wherein the first angle and the second angle are dynamically adjusted approximately between 0° and 30°, and the first side is opposite to the second side.

9. The method according to claim 8, wherein:
    ions used in the ion implantation process include phosphorus (P) ions, arsenic (As) ions, carbon (C) ions, or boron (B) ions;
    dosage of the ions used in the ion implantation process is approximately between $10^{15}$ and $10^{17}$ ions/cm$^2$; and
    an energy level of the ions used in the ion implantation process is approximately between 15 keV and 60 keV.

10. The method according to claim 9, wherein:
    the ions used in the ion implantation process are phosphorus (P) ions;
    the dosage of the ions used in the ion implantation process is approximately $10^{16}$ ions/cm$^2$; and
    the energy level of the ions used in the ion implantation process is approximately 30 keV.

11. A three-dimensional (3D) NAND memory device, comprising:
    a substrate;
    a layer stack on the substrate and comprising a plurality of alternating layers of an oxide layer and a conductive material layer;

memory cells in the layer stack; and gate line slit structures in the layer stack to separate the memory cells into blocks, wherein each of the gate line slit structures includes a gate line slit that extends along a first direction perpendicular to the alternating layers of the oxide layer and the conductive material layer and also extends along a second direction perpendicular to the first direction, and the conductive material layer has a recessed surface between adjacent oxide layers and the recessed surface of the conductive material layer is adjacent to a corresponding gate line slit structure.

12. The 3D NAND memory device according to claim 11, wherein each of the gate line slit structures includes:

a spacer layer on a sidewall and a bottom of the gate line slit, wherein the spacer layer further extends between the adjacent oxide layers and on the recessed surface of the conductive material layer.

13. The 3D NAND memory device according to claim 11, further comprising:

a high-K material layer surrounding each of the oxide layers, wherein the high-K material layer is on sidewalls of a gate line slit of each of the gate line slit structures.

14. The 3D NAND memory device according to claim 13, wherein:

the high-K material layer is made of a material including hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

15. The 3D NAND memory device according to claim 13, wherein:

the high-K material layer includes a combination of aluminum oxide and titanium nitride.

16. The 3D NAND memory device according to claim 13, wherein:

the high-K material layer is further on a bottom surface of the gate line slit.

17. The 3D NAND memory device according to claim 11, wherein:

the conductive material layer is made of a material including tungsten (W), cobalt (Co), copper (Cu), aluminum (Al), doped silicon, or a combination thereof.

18. The 3D NAND memory device according to claim 13, further comprising:

a second conductive material layer on the high-K material layer and between the adjacent oxide layers.

19. The 3D NAND memory device according to claim 13, wherein:

a spacer layer is on the high-K material layer along the sidewall of the gate line slit and further on the high-K material layer between the adjacent oxide layers.

20. The 3D NAND memory device according to claim 19, wherein:

the spacer layer is further on the high-k material layer that is on the bottom of the gate line slit.

* * * * *